(12) United States Patent
Kawaji et al.

(10) Patent No.: US 6,169,299 B1
(45) Date of Patent: Jan. 2, 2001

(54) SEMICONDUCTOR DEVICE

(75) Inventors: Sachiko Kawaji; Toshio Murata; Masayasu Ishiko; Tsutomu Uesugi, all of Aichi (JP)

(73) Assignee: Kabushiki Kaisha Toyota Chuo Kenkyusho, Aichi-gun (JP)

(*) Notice: Under 35 U.S.C. 154(b), the term of this patent shall be extended for 0 days.

(21) Appl. No.: 09/258,818

(22) Filed: Feb. 26, 1999

(30) Foreign Application Priority Data

Feb. 27, 1998 (JP) .................................................. 10-064199
Jan. 13, 1999 (JP) .................................................. 11-006540

(51) Int. Cl.$^7$ ............................ H01L 29/74; H01L 31/111
(52) U.S. Cl. ........................ 257/137; 257/138; 257/139; 257/144
(58) Field of Search .................................. 257/137–139, 257/144, 147, 212, 350

(56) References Cited

U.S. PATENT DOCUMENTS

| | | | |
|---|---|---|---|
| 5,291,040 | * 3/1994 | Oppermann et al. | 257/133 |
| 5,306,930 | * 4/1994 | Baliga | 257/147 |
| 5,389,801 | 2/1995 | Terashima et al. | 257/139 |
| 5,396,087 | * 3/1995 | Baliga | 257/139 |
| 5,413,313 | * 5/1995 | Mutterlein et al. | 257/137 |
| 5,460,981 | 10/1995 | Terashima et al. | 438/138 |
| 5,463,241 | * 10/1995 | Kubo | 257/376 |
| 5,703,384 | * 12/1997 | Brunner | 257/139 |

* cited by examiner

Primary Examiner—Olik Chaudhuri
Assistant Examiner—Hoai Pham
(74) Attorney, Agent, or Firm—Oblon, Spivak, McClelland, Maier & Neustadt, P.C.

(57) ABSTRACT

The MOS gate thyristor of the present invention has a p$^+$ type anode layer (first semiconductor layer), an n$^-$ type base region (second semiconductor layer) with the function of acting as a drift layer, a p$^-$ type base region (third semiconductor layer), and an n$^+$ type impurity diffusion layer (fourth semiconductor layer) with the function of acting as a source region. On the surface of the base region, an n$^+$ type floating emitter region (fifth semiconductor layer) is formed, while a first channel region (sixth semiconductor layer) is formed between the impurity diffusion layer and the floating emitter region. At the lower ends of the fourth semiconductor layer and the first channel region an insulation layer is formed. The insulation layer acts to suppress the operation of a parasitic thyristor to ensure a reliable turn-off operation of the transistor. A portion of the semiconductor extends from the n$^+$ type floating emitter region and lies underneath the insulation layer in the direction alongside the principal plane of the p$^+$ type anode layer. The extended semiconductor portion helps broaden the carrier injection path.

20 Claims, 11 Drawing Sheets

FIG. I

SEMICONDUCTOR DEVICE

BACKGROUND OF THE INVENTION

1. Field of the Invention

The present invention relates to a bipolar type semiconductor device having a MOS gate and, more specifically, to a semiconductor device suitable for use in a thyristor.

2. Related Art

A MOS thyristor, i.e. a combination of a MOSFET with a thyristor structure, is a transistor within which a MOS gate acts to supply electrons from a cathode to a floating emitter region as well as to provide holes from an anode to a base region, thereby performing a thyristor action within the transistor.

FIG. 11 shows an example of a conventional MOS thyristor. The MOS thyristor comprises a $p^+$ type emitter layer 10, an $n^+$ type buffer layer 12, an $n^-$ type base region 14, a $p^-$ type base region 16, a floating emitter region 22, and $N^+$ type impurity diffusion layers 18a and 18b. Furthermore, a gate electrode 40 is formed on the surfaces of the $p^-$ type base region 16 and the $n^+$ type impurity diffusion layer 18b that functions as a source region via a gate insulation layer 42. The operation of a thyristor is regulated by driving a MOS gate with the gate electrode 40. Namely, the $n^+$ type impurity diffusion layer 18b (i.e. the source region), the $p^-$ type base region 16, the $n^-$ type base region 14, the $n^+$ type buffer layer 12, and the $p^+$ type emitter layer 10 constitute an insulated-gate bipolar transistor (hereinafter abbreviated as "IGBT") for a thyristor action.

When a thyristor is activated in the MOS thyristor described above, electron injection occurs from the $n^+$ type floating emitter region 22 into the $p^-$ type base region 16 and at the same time holes are provided from the $p^+$ type emitter layer 10 through the $n^-$ type base region 14 into the $p^-$ type base region 16. However, in a transistor having such a structure, the regulating function of the MOS gate is lost and the turn-off operation on the thyristor becomes unavailable when a latch-up phenomenon occurs due to a high injection condition in a parasitic thyristor consisting of the $n^+$ type emitter region 18a, $p^-$ type base region 16, $n^-$ type base region 14, $n^+$ type buffer layer 12, and $p^+$ type emitter layer 10. For this reason, an attempt is made to raise the doping level of a $p^-$ type base region 16 directly underneath a cathode electrode 50 or to increase its diffusion depth so that latch-up of the parasitic thyristor is prevented. However, increasing the doping level of the $p^-$ type base region directly underneath the cathode electrode in order to sufficiently prevent latch-up of the parasitic thyristor results in a more complicated fabrication process. Also, increasing the diffusion depth leads to an increase in the unit cell size, making the safe operating area narrower and the ON-state voltage higher as well.

SUMMARY OF THE INVENTION

Accordingly, an object of the present invention is to provide a bipolar type semiconductor device containing a MOS gate, which allows a further reduction of the ON-state voltage as well as a reliable turn-off action as enabled by suppressing the operation of a parasitic thyristor.

The semiconductor device of the present invention comprises:

a first semiconductor layer of a first conductive type;

a second semiconductor layer of a second conductive type formed on one side of the principal planes of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, which can form a channel region;

a gate electrode formed via an interposed gate insulation layer on the surface of at least the sixth semiconductor layer;

an insulation layer located within the third semiconductor layer and formed either at or near the extremities of at least the fourth semiconductor layer as well as the sixth semiconductor layer on the sides facing the first semiconductor layer;

a first main electrode formed on the surfaces of the third semiconductor layer and the fourth semiconductor layer; and a second main electrode formed on the other side of the principal planes of the first semiconductor layer, wherein the fifth semiconductor layer has an extended semiconductor portion extending in the direction parallel to the principal plane of the first semiconductor layer.

In the above semiconductor device, a MOS transistor is formed by the fourth semiconductor layer functioning as a source region, the sixth semiconductor layer which can form a channel region, and the fifth semiconductor layer which functions as a drain region as well as a floating emitter region. At the same time, a thyristor is formed by the first, second, third, and fifth semiconductor layers.

In this semiconductor device, the latch-up action of the parasitic thyristor, which exists directly underneath the first main electrode functioning as a cathode electrode, can be prevented by forming an insulation layer at or near the extremities of the fourth semiconductor layer, which functions either as a source region or an emitter region, and the sixth semiconductor layer which can form a channel region.

In other words, by forming the insulation layer at the lower-ends of the fourth semiconductor layer, which functions either as a source region or an emitter region, and the sixth semiconductor layer which can form a channel region, preferably in a manner whereby it traverses the operating regions (i.e. in the direction parallel to the principal plane of the first semiconductor layer), the operation of the parasitic thyristor formed underneath the first main electrode can be suppressed even under a high injection condition wherein a voltage is applied to the second main electrode which functions as an anode electrode, since the fourth semiconductor layer and the sixth semiconductor layer are electrically isolated from the second semiconductor layer by the above insulation layer. Consequently, the semiconductor device of the present invention can perform the turn-on and turn-off operations more reliably than transistors based on conventional configurations.

In addition to these effects, since a portion (extended semiconductor portion) of the fifth semiconductor layer which functions as a floating emitter region is formed in such a manner it stretches in the direction parallel to the principal plane of the first semiconductor layer at the backside (i.e. on the side facing the first semiconductor layer) of the insulation layer, the path for carrier injection from the floating emitter region can be broadened, thereby facilitating the electric current and enabling a reduction of the ON-state voltage.

For the semiconductor device of the present invention, it is preferable to form a high resistance region in the fifth semiconductor layer and in contact with the sixth semiconductor layer. Such a high resistance region formed in a portion of the fifth semiconductor layer which functions as a floating emitter region ensures a reliable turn-off operation. This is because the electric field applied to the pn junction comprising the channel region (i.e. the sixth semiconductor layer) of the first conductive type and the floating emitter region (i.e. the fifth semiconductor layer) of the second conductive type can be relieved by the high resistance region when a thyristor containing a MOS gate is being turned-off. Thus, the pn junction comprising the channel region and the floating emitter region is not subjected to a breakdown current, enabling a reliable turn-off operation for the transistor.

In the semiconductor device of the present invention, it is preferable to form a gate insulation layer and a gate electrode an area covering not only the sixth semiconductor layer which can form a channel region but also on the surfaces of the fifth semiconductor layer which functions as a drain region (floating emitter region) and the third semiconductor layer. With such a configuration, an IGBT active region can be formed on the surface of the transistor. By forming a floating emitter region for the thyristor on the surface of the transistor and further forming an IGBT active region using the floating emitter region in the manner described above, an effective utilization of the chip surface is enabled.

The semiconductor device of the present invention may further comprise:

a seventh semiconductor layer of the second conductive type selectively formed apart from the fifth semiconductor layer;

an eighth semiconductor layer of the first conductive type located between the fifth semiconductor layer and the seventh semiconductor layer, which can form a channel region;

a gate electrode formed via an interposed gate insulation layer on the surface of at least the third semiconductor layer that is in contact with the seventh semiconductor layer;

an insulation layer located within the third semiconductor layer and formed either at or near the extremities of at least the seventh semiconductor layer as well as the eighth semiconductor layer on the sides facing the first semiconductor layer; and a main electrode formed on the surface of the seventh semiconductor layer, wherein the two gate electrodes can be operated independently of each other.

In the above-mentioned semiconductor device, an IGBT region is formed on a portion of the transistor surface which is different from the MOS gate thyristor, and the MOS gate thyristor and the IGBT can be independently controlled by individually regulating the respective gate electrodes.

For a semiconductor device in which the MOS gate thyristor and the IGBT are formed on the different regions, it is preferable to form a ninth semiconductor layer of the second conductive type on the surface of the third semiconductor layer apart from the seventh semiconductor layer. In this semiconductor device, the latch-up action of the parasitic thyristor at a high injection condition can also be prevented by the formation of the ninth semiconductor layer which functions as a floating emitter region in the IGBT region formed on the transistor surface.

In other words, in the case where an IGBT region and a thyristor region are separately formed on the surface of a transistor in a conventional semiconductor device, there is a risk of having a parasitic thyristor action caused also on the IGBT region on the same surface when a thyristor mode has produced a high injection condition on the entire transistor. By contrast, in the semiconductor device of the present invention as described above, operation of the parasitic thyristor can be suppressed since the carriers injected from the second main electrode at the ninth semiconductor layer disappear through recombination.

In the semiconductor device of the present invention, it is preferable that the fifth semiconductor layer be further configured as described below.

It is preferable, for example, that the fifth semiconductor layer further comprises a high resistance region in contact with the sixth semiconductor layer. By providing such a high resistance region the electric field applied on the pn junction comprising the sixth semiconductor layer of the first conductive type and the fifth semiconductor layer of the second conductive type can be relieved when a MOS gate thyristor is being turned-off. Thus, the pn junction is protected from a breakdown current, ensuring a reliable turn-off operation for the transistor.

Alternatively, the fifth semiconductor layer may have a conductor portion comprising a Schottky metal, in place of the semiconductor portion formed along the direction of the principal plane of the first semiconductor layer. Such a conductor portion helps improve the forward conduction characteristics over a pn junction.

It is preferable that, in any of the semiconductor devices of the present invention, an embedded electrode be formed within the insulation layer. By applying an appropriate voltage to the embedded electrode when the transistor is turned off the electric field applied on the pn junction comprising the channel region (i.e. the sixth semiconductor layer) of the first conductive type and the floating emitter region (i.e. the fifth semiconductor layer) of the second conductive type can be relieved, enabling a more reliable turn-off operation for the transistor.

Moreover, in any of the semiconductor devices of the present invention, it is preferable that the extended semiconductor portion of the fifth semiconductor layer be formed separately from the insulation layer and that a semiconductor layer of the first conductive type be interposed between the extended semiconductor portion and the insulation layer. The existence of such a semiconductor layer of the first conductive type ensures that the parasitic channel region (i.e. "back channel") existing on the surface of the insulation layer is prevented from becoming active by the effects of the anode potential.

DETAILED DESCRIPTION OF PREFERRED EMBODIMENTS

First Embodiment

Figure 1:
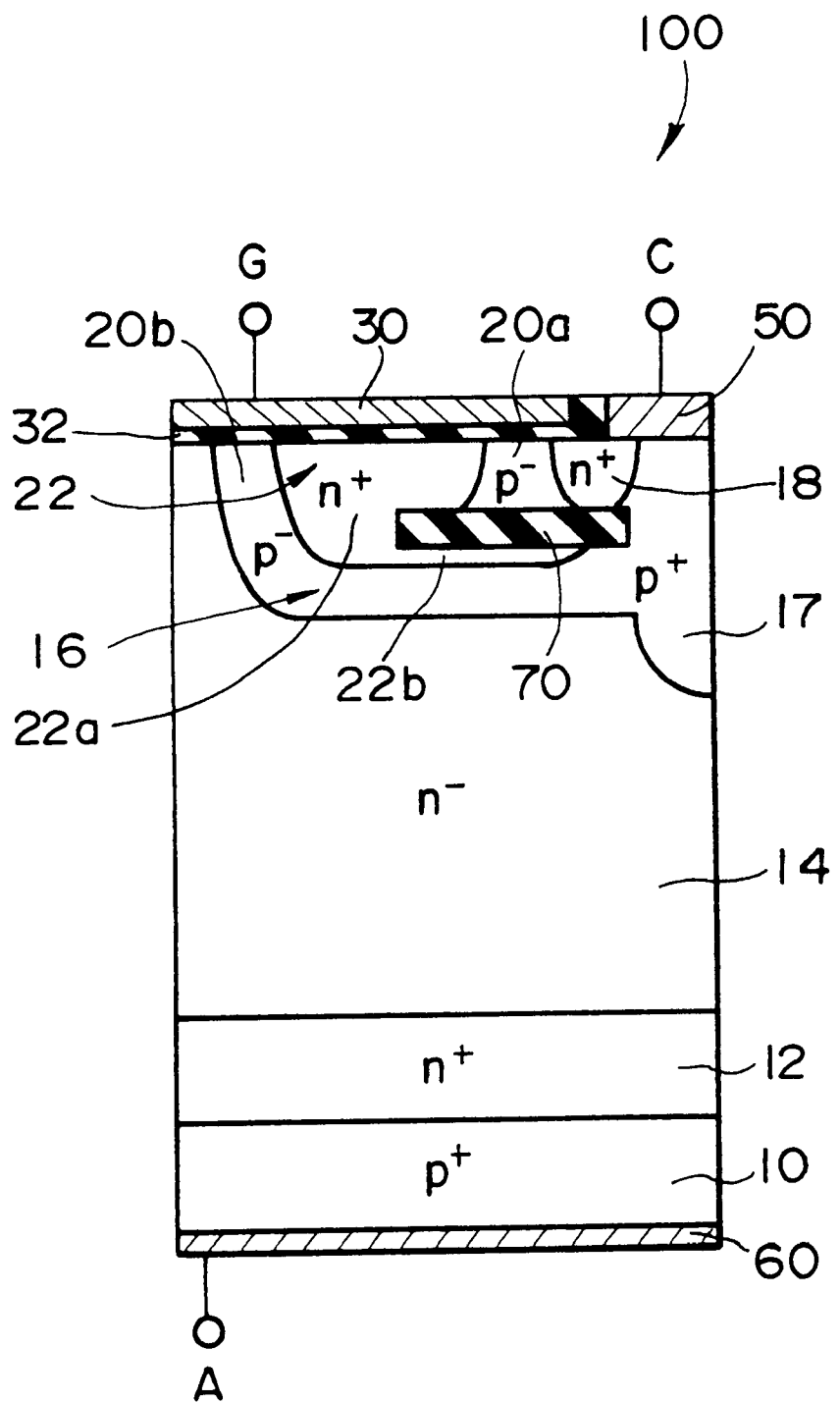
FIG. 1 is a cross-sectional view schematically showing a MOS gate thyristor according to the first embodiment of the present invention.

FIG. 1 is a cross-sectional view schematically showing a MOS gate-controlled thyristor 100 (i.e. MOS gate thyristor) in accordance with the present invention.

Configuration

In the MOS gate thyristor 100 of the present embodiment, an $n^+$ type buffer layer 12 is formed on one side of the principal planes of a $p^+$ type anode layer 10 (first semiconductor layer) comprising a low resistance semiconductor substrate with the function of acting as an emitter region. On the surface of the buffer layer 12 is formed an $n^-$ type base region 14 (second semiconductor layer) with the function of acting as a drift layer. On the surface of the $n^-$ type base region 14 is formed a $p^-$ type base region 16 (third semiconductor layer) on which an $n^+$ type impurity diffusion layer 18 (fourth semiconductor layer) is selectively formed with the function of acting as a source region for the MOSFET. Moreover, on the surface of the $p^-$ type base region 16, an $n^+$ type floating emitter region 22 (fifth semiconductor layer) is selectively formed apart from the $n^+$ type impurity diffusion layer 18.

The above $n^+$ type floating emitter region 22 comprises a first floating emitter region 22a, formed on the surface of the $p^-$ type base region 16, and a second floating emitter region 22b (extended semiconductor portion) that is contiguous to the lower end of the floating emitter region 22a and extending in the direction of the principal plane of the $p^+$ type anode layer 10.

In a portion of the $p^-$ type base region 16 between the $n^+$ type impurity diffusion layer 18 and the floating emitter region 22 a first channel region 20a (sixth semiconductor layer) is formed, while a second channel region 20b is formed in a portion of the $p^-$ type base region 16 between the $n^+$ type floating emitter region 22 and the $n^-$ type base region 14. Moreover, a $p^+$ type base region 17 for preventing latch-up of a parasitic thyristor is formed on the outside of the $n^+$ type impurity diffusion layer 18.

At the lower ends of the $n^+$ type impurity diffusion layer 18, the first channel region 20a, and the $n^+$ type floating emitter region 22, an insulation layer 70 is formed in such a way that it almost comes in contact with these regions and lies in the direction of the principal plane of the $p^+$ type anode layer 10. In other words, the first channel region 20a is delimited by the $n^+$ type impurity diffusion layer 18, the floating emitter region 22, and the insulation layer 70.

On the surface of the $n^+$ type impurity diffusion layer 18, the first channel region 20a, the $n^+$ type floating emitter region 22, and the second channel region 20b, a gate electrode 30 is formed via an interposed gate insulation layer 32. On the surface of the $n^+$ type impurity diffusion layer 18 and the $p^+$ type base region 17 a cathode electrode 50 as the first main electrode is formed. An anode electrode 60 is formed on the other principal plane of the $p^+$ type anode layer 10 as the second main electrode.

In the MOS gate thyristor 100 of the present embodiment, an npnp thyristor is constituted by the $n^+$ type floating emitter region 22, the $p^-$ type base region 16, the $n^-$ type base region 14, the $n^+$ type buffer layer 12, and the $p^+$ type anode layer 10.

Meanwhile, an IGBT is constituted by the $n^+$ type impurity diffusion layer 18 (source region), the first channel region 20a, the $n^+$ type floating emitter region 22, the second channel region 20b, the n type base region 14, the $n^+$ type buffer layer 12, and the $p^+$ type anode layer 10 (emitter region).

Operation

The operation of the MOS gate thyristor 100 of the present embodiment is described as follows.

First, the IGBT is activated by applying a required positive potential between the gate electrode 30 and the anode electrode 60. In the activation process of the IGBT, electrons flow from the $n^+$ type impurity diffusion layer 18 into the $N^+$ type floating emitter region 22 through the first channel region 20a, further flow through an accumulation region formed along the gate insulation layer 32 in the floating emitter region 22, and flow furthermore through the second channel region 20b into the $n^-$ type base region 14. Meanwhile, since a positive potential is applied to the anode electrode 60, holes are provided from the $p^+$ type anode layer 10 through the $n^+$ type buffer layer 12 into the $n^-$ type base region 14. Thus, the $n^-$ type base region 14 is saturated with electrons and holes to bring the IGBT up to an active mode.

Further, by raising the voltage at the anode electrode 60, holes provided from the $p^+$ type anode layer 10 are led to flow into the $p^-$ type base region 16 to reduce the resistance of the $p^-$ type base region 16. As a result, the pnpn thyristor consisting of the $p^+$ type anode layer 10, the $n^+$ type buffer layer 12, the $n^-$ type base region 14, the $p^-$ type base region 16, and the $n^+$ type floating emitter region 22 goes into a latch-up condition to trigger a thyristor action.

As described above, the IGBT functions as a trigger to activate the thyristor action. Since the MOSFET portion of the IGBT is formed along the gate electrode 30 which also functions as the gate for the thyristor, holes can be provided more easily from the $p^+$ type anode layer 10 than in a conventional transistor, thereby providing a thyristor which can control higher current levels with a short turn-on time.

Moreover, by forming a floating emitter region 22 of the thyristor on the surface of the transistor, and also forming the IGBT region by utilizing the floating emitter region 22, the present embodiment enables more efficient utilization of the chip area compared to a configuration in which a thyristor and an IGBT are formed separately.

Furthermore, in the MOS gate thyristor 100, since the second floating emitter region 22b is formed so that it stretches along the direction of the principal plane of the $p^+$ type anode layer 10, a broader path for injecting electrons can be secured to reduce the ON-state voltage.

In the process of turning off the MOS gate thyristor 100, the gate electrode 30 is brought to an OFF state so that the potential on the n+ type floating emitter region 22 is cut off from the cathode electrode 50, thereby terminating the thyristor action.

In the present embodiment, by forming the insulation layer 70 at the lower-ends of the n+ type impurity diffusion layer 18 which functions as a source region and a cathode region the first channel region 20a and in such a way that it traverses the operating region, the operation of the parasitic thyristor formed underneath the cathode electrode 50 can be suppressed even under a high injection condition wherein a voltage is applied on the anode electrode 60, since the n+ type impurity diffusion layer 18 and the first channel region 20a are electrically isolated from the n− type base region 14 by the insulation layer 70. Consequently, the semiconductor device of the present embodiment can perform the turn-on and turn-off operations more reliably than transistors based on a conventional configuration. Since this effect is common to the present invention and equally available in all other embodiments, description of this feature will be omitted in other embodiments.

Second Embodiment

Figure 2:
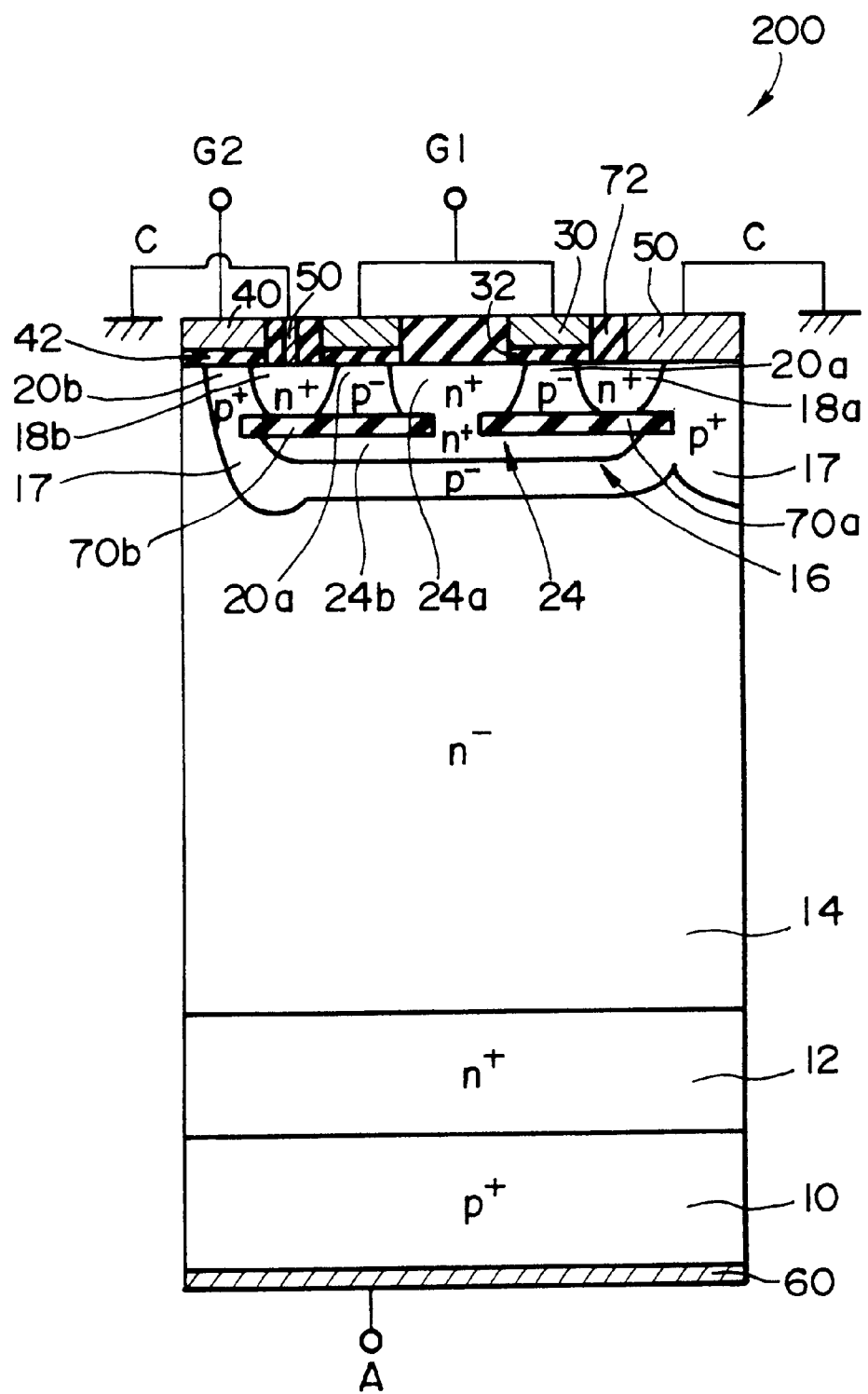
FIG. 2 is a cross-sectional view schematically showing a MOS gate thyristor according to the second embodiment of the present invention.

FIG. 2 is a cross-sectional view schematically showing a MOS gate-controlled thyristor, the MOS gate thyristor 200, in accordance with the present invention.

Configuration

In the MOS gate thyristor 200 of the present embodiment, an n+ type buffer layer 12 is formed on one side of the principal planes of a p+ type anode layer 10 (first semiconductor layer) comprising a p+ type silicon substrate with the function of acting as an anode layer. On the surface of the buffer layer 12, an n− type base region 14 (second semiconductor layer) is formed with the function of acting as a drift region. On the surface of the n− type base region 14 a p− type base region 16 (third semiconductor layer) is formed, around which a p+ type base region 17 is formed with a deeper diffusion depth than the p− type base region 16. On the surface of the p− type base region 16, n+ type impurity diffusion layers 18a (fourth semiconductor layer) and 18b (seventh semiconductor layer) are selectively formed with the function of acting as a source region for the MOSFET. Moreover, within the p− type base region 16, an n+ type floating emitter region 24 (fifth semiconductor layer) is selectively formed at a location separated from the n+ type impurity diffusion layers 18a and 18b.

The above n+ type floating emitter region 24 comprises of a first floating emitter region 24a, formed on the surface of the p− type base region 16, and a second floating emitter region 24b (extended semiconductor portion) which is contiguous to the lower end of the floating emitter region 24a and extends in the direction of the principal plane of the p+ type anode layer 10. At respective positions of a p+ type base region (eighth semiconductor layer) between the n+ type impurity diffusion layer 18a and the first floating emitter region 24a, and also between the n+ type impurity diffusion layer 18b and the first floating emitter region 24a, first channel regions 20a and 20a are formed. Moreover, in a portion of the p+ type base region 17 existing between the n+ type impurity diffusion layer 18b and the n− type base region 14 a second channel region 20b is formed.

At the lower ends of the n+ type impurity diffusion layer 18a and the first channel region 20a, and also of the n+ type impurity diffusion layer 18b and the first channel region 20a, insulation layers 70a and 70b are respectively formed in such a way that they almost come in contact with the above regions and lie in the direction of the principal plane of the p+ type anode layer 10. Accordingly, one first channel region 20a is delimited by the n+ type impurity diffusion layer 18a, the first floating emitter region 24a, and the insulation layer 70a. Similarly, the other of the first channel region 20a is delimited by the n+ type impurity diffusion layer 18b, the first floating emitter region 24a, and the insulation layer 70b.

On the surface of the n+ type impurity diffusion layers 18a and 18b and the p− type base region 16, a first gate electrode 30 is formed via an interposed gate insulation layer 32. A second gate electrode 40 is formed on the surface of part of the N+ type impurity diffusion layer 18b and the p+ type base region 17, via an interposed gate insulation layer 42. The cathode electrodes 50 and 50 as the first main electrode are formed on the surface of the n+ type impurity diffusion layer 18a and the p+ type base region 17, as well as on the surface of the n+ type impurity diffusion layer 18b. The gate electrode 30 and the cathode electrode 50 are electrically isolated by an insulation layer 72. An anode electrode 60 is formed on the other principal plane of the p+ type anode layer 10 as the second main electrode.

In the MOS gate thyristor 200 of the present embodiment, an npnp thyristor is constituted by the n+ type floating emitter region 24, the p− type base region 16, the n− type base region 14, the n+ type buffer layer 12, and the p+ type anode layer 10.

The n+ type impurity diffusion layers 18a and 18b, n+ type floating emitter region 24 (drain region), the first gate electrode 30, and the first channel regions 20a and 20a constitute two MOSFETs. With those MOSFETs, electrons are supplied to the floating emitter region 24 constituting the npnp thyristor.

Meanwhile, an IGBT is constituted by the n+ type impurity diffusion layer 18b, the second channel region 20b, the n− type base region 14, the n+ type buffer layer 12, and the p+ type anode layer 10.

Operation

The operation of the MOS gate thyristor 200 of the present embodiment is described as follows.

With the MOS gate thyristor 200 of the present embodiment, since the IGBT is provided with the second gate electrode 40 rather than the first gate electrode 30, the first gate electrode 30 and the second gate electrode 40 can be operated independently of each other.

To turn on the MOS gate thyristor 200, the second gate electrode 40 is first turned on to bring the IGBT to the ON state, which triggers the hole injection from the p+ type anode layer 10. Concurrently with the hole formation from the p+ type anode layer 10, the first gate electrode 30 is turned on to inject electrons from the n+ type impurity diffusion layers 18a and 18b, through the first channel region 20a, into the n+ type floating emitter region 24 which functions as a drain region. Since the potential level for the floating emitter region 24 is not fixed, it increases as the anode potential increases and accordingly acts as a drain for the MOSFET. With the MOSFET acting to inject electrons into the floating emitter region 24 and the IGBT acting to provide holes from the p+ type anode layer 10, thereby lowering the potential barrier at the p− type base region 16 directly underneath the floating emitter region 24, the multiple carriers in the floating emitter region 24 and the p− type base region 16 initiate the thyristor action.

Also, since the second floating emitter region 24b is formed so that it extends in the direction of the principal plane of the p+ type silicon substrate (p+ type anode layer) 10, a broader path for injecting electrons can be secured to assist the flow of the electric current, thereby reducing the ON-state voltage.

Since the present embodiment is able to provide a condition wherein the thyristor can be easily activated by first turning the IGBT on, the turn-on time of the transistor can be shortened.

In the process of turning off the MOS gate thyristor 200, at first, the first gate electrode 30 is brought to an OFF state to shift the internal operation of the transistor from a thyristor mode to an IGBT mode. Thereafter, the carrier action within the transistor can be terminated certainly in a short period of time by cutting off the second gate electrode 40.

Third Embodiment

Figure 3:
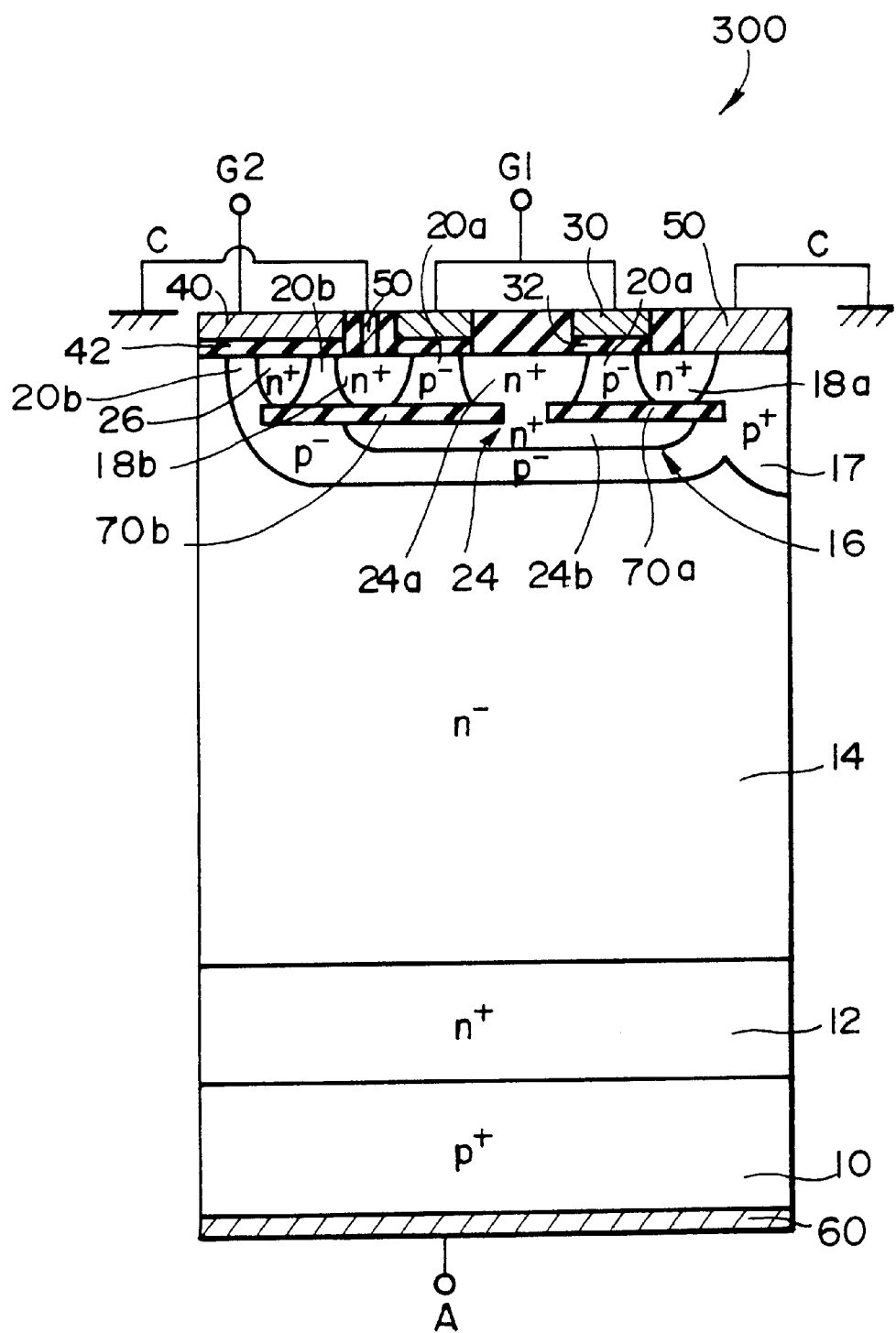
FIG. 3 is a cross-sectional view schematically showing a MOS gate thyristor according to the third embodiment of the present invention.

FIG. 3 is a cross-sectional view schematically showing a MOS gate-controlled thyristor, the MOS gate thyristor 300, in accordance with the present invention. In describing the present embodiment, constituents and their arrangements which are essentially identical to the MOS gate thyristor 200 of the second embodiment of the present invention are referred to with the same symbols and without detailed explanations.

In the present embodiment, the IGBT is configured differently from the above-described second embodiment. Specifically, in the second embodiment of the present invention, as a means for preventing latch-up of a parasitic thyristor of IGBT, a $p^+$ type base region 17 which is heavily doped with a $p^-$ type impurity and also has a greater diffusion depth is formed on the outside of the $n^+$ type impurity diffusion layer 18b which acts as a source region.

By contrast, in the present embodiment, instead of providing the $p^+$ type base region 17 in the IGBT region as in the second embodiment, an $n^+$ type impurity diffusion layer 26 (ninth semiconductor layer) is formed on the surface of the $p^-$ type base region 16 in an electrically floating condition. The $n^+$ type impurity diffusion layer 26 is formed apart from the $n^+$ type impurity diffusion layer 18b. Between the $n^+$ type impurity diffusion layer 18b and the $n^+$ type impurity diffusion layer 26, a second channel region 20b (tenth semiconductor layer) is formed. The insulation layer 70b formed at the lower ends of the first channel region 20a and the $n^+$ type impurity diffusion layer 18b is extended to reach the lower end of the above-mentioned $n^+$ type impurity diffusion layer 26.

By providing the $n^+$ type impurity diffusion layer 26 in the channel region (the second channel region 20b) of the IGBT as described above, the holes provided from the $p^+$ type base layer 10 disappear in the $n^+$ type impurity diffusion layer 26 through recombination with electrons, even if a high injection condition is created to activate a parasitic thyristor of the IGBT. In other words, since the $n^+$ type impurity diffusion layer 26 in a floating condition without fixed potential functions as a hole eliminator holes, it can regulate the flow of holes into the $n^+$ type impurity diffusion layer 18b with the function of acting as a source region.

Other aspects of the present embodiment are the same as those already described in the second embodiment. Additionally, the formation of an impurity diffusion layer which functions as a hole eliminator, which characterizes the present embodiment, may be applied to other embodiments of the present invention as well.

Fourth Embodiment

Figure 4:
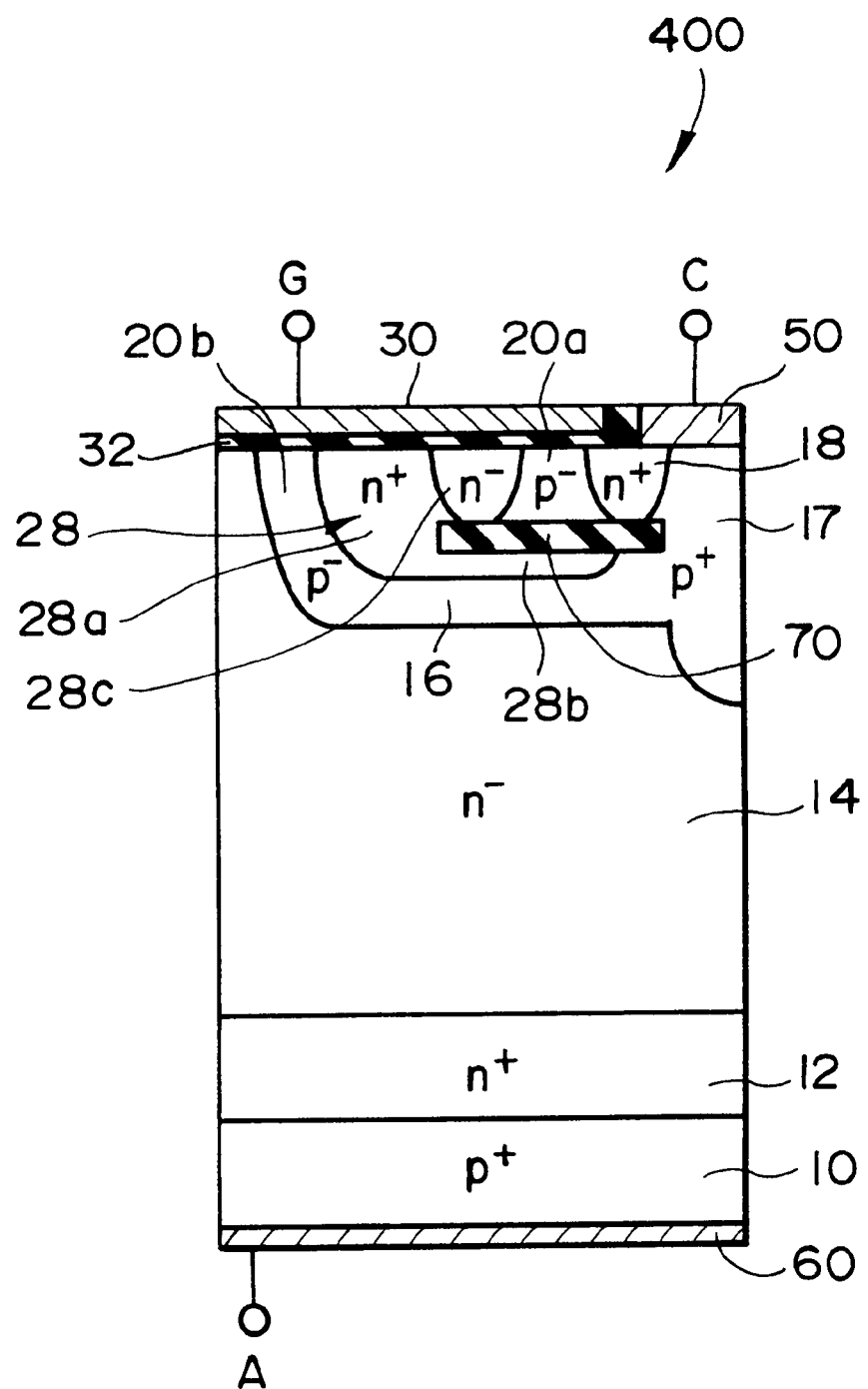
FIG. 4 is a cross-sectional view schematically showing a MOS gate thyristor according to the fourth embodiment of the present invention.

FIG. 4 is a cross-sectional view schematically showing a MOS gate-controlled thyristor, i.e. the MOS gate thyristor 400, in accordance with the present invention. The MOS gate thyristor 400 differs from the above MOS gate thyristor 100 of the first embodiment, with respect to the configuration of the floating emitter region.

Configuration

In the MOS gate thyristor 400 of the present embodiment, an $n^+$ type buffer layer 12 is formed on one side of the principal planes of a $p^+$ type anode layer 10 (first semiconductor layer) comprising a low resistance semiconductor substrate. On the surface of the buffer layer 12 an $n^-$ type base region 14 (second semiconductor layer) which functions as a drift layer is formed. On the surface of the $n^-$ type base region 14 a $p^-$ type base region 16 (third semiconductor layer) is formed with an $n^+$ type impurity diffusion layer 18 (fourth semiconductor layer) selectively formed thereon to function as a source region for the MOSFET. Moreover, on the surface of the $p^-$ type base region 16, an $n^+$ type floating emitter region 28 (fifth semiconductor layer) is selectively formed apart from the $n^+$ type impurity diffusion layer 18.

The floating emitter region 28 comprises of an $n^+$ type first floating emitter region 28a that is formed on the surface of the $p^-$ type base region 16, a second floating emitter region 28b (extended semiconductor portion) formed at the lower end of an insulation layer 70, which is to be described later, in the direction of the principal plane of the $p^+$ type anode layer 10, and an $n^-$ type third floating emitter region 28c. In other words, the present embodiment is characterized in that a portion of the floating emitter region 28 which is in contact with the MOSFET channel region 20a is formed with a high resistance region. As described later in detail, forming a portion of the floating emitter region 28 with a high resistance region (third floating emitter region 28c) in the above-mentioned manner ensures a reliable turn-off operation of the transistor.

Further, in a portion of the $p^-$ type base region 16 between the $n^+$ type impurity diffusion layer 18 and the floating emitter region 28 a first channel region 20a (sixth semiconductor layer) is formed, while a second channel region 20b is formed in a portion of the $p^-$ type base region 16 between the first $n^+$ type floating emitter region 28a and the n type base region 14. Moreover, a $p^+$ type base region 17 for preventing latch-up of a parasitic thyristor is formed on the outside of the $n^+$ type impurity diffusion layer 18.

At the lower ends of the $n^+$ type impurity diffusion layer 18, the first channel region 20a, and the $n^-$ type third floating emitter region 28c, an insulation layer 70 is formed in such a way that it almost comes in contact with the above regions and in the direction of the principal plane of the $p^+$ type anode layer 10.

In addition, on the surface of the $n^+$ type impurity diffusion layer 18, the first channel region 20a, the floating emitter region 28, and the second channel region 20b, a gate electrode 30 is formed via an interposed gate insulation layer 32. On the surface of the $n^+$ type impurity diffusion layer 18 and the $p^+$ type base region 17 a cathode electrode 50 is formed as the first main electrode. An anode electrode 60 is formed on the other principal plane of the $p^+$ type anode layer 10 as the second main electrode.

In the MOS gate thyristor 400 of the present embodiment, an npnp thyristor is constituted by the floating emitter region 28, the $p^-$ type base region 16, the $n^-$ type base region 14, the $n^+$ type buffer layer 12, and the $p^+$ type anode layer 10.

Meanwhile, an IGBT is constituted by the $n^+$ type impurity diffusion layer 18 (source region), the first channel region 20a, the floating emitter region 28, the second channel region 20b, the $n^-$ type base region 14, the $n^+$ type buffer layer 12, and the $p^+$ type anode layer 10.

Operation

The operation of the MOS gate thyristor 400 of the present embodiment is described as follows.

First, the IGBT is activated by applying a required positive potential between the gate electrode 30 and the anode electrode 60. In the activation process of the IGBT, electrons flow from the $n^+$ type impurity diffusion layer 18 into the second $n^+$ type floating emitter region 28b and into the first floating emitter region 28b through the first channel region 20a, and flow further through the second channel region 20b into the n⁻ type base region 14. Meanwhile, since a positive potential is applied to the anode electrode 60, holes flow from the p⁺ type anode layer 10 through the n⁺ type buffer layer 12 into the n⁻ type base region 14. Thus, the n⁻ type base region 14 is saturated with electrons and holes to bring the IGBT up to active mode.

Further, by raising the voltage at the anode electrode 60, holes provided from the p⁺ type anode layer 10 into the p⁻ type base region 16 to reduce the resistance of the p⁻ type base region 16. Consequently, the pnpn thyristor consisting of the p⁺ type anode layer 10, the n⁺ type buffer layer 12, the n⁻ type base region 14, the p⁻ type base region 16, and the n type floating emitter region 28 goes into a latch-up condition to trigger a thyristor action.

As described above, the IGBT functions as a trigger to activate the thyristor action. Since the MOSFET portion of the IGBT is formed along the gate electrode 30 that also functions as the gate for the thyristor, the hole injection from the p⁺ type anode layer 10 can be facilitated more easily than a prior art transistor, thereby providing a thyristor which can control higher current levels with a short turn-on time.

Moreover, by forming a floating emitter region 28 of the thyristor on the surface area of the transistor, and also forming the IGBT region by utilizing the floating emitter region 28, the present embodiment enables more efficient utilization of the chip area compared to a configuration in which a thyristor and an IGBT are formed in separate areas.

In the process of turning off the MOS gate thyristor 400, the gate electrode 30 is brought to the OFF state so that the potential on the floating emitter region 28 is cut off from the cathode electrode 50, thereby terminating the thyristor action.

Since the MOS gate thyristor 400 of the present embodiment has a third floating emitter region 28c comprising a high resistance region in the floating emitter region 28, this ensures a reliable turn-off operation. This is because the electric field applied to the pn junction comprising the p⁻type first channel region 20a and the n⁻type floating emitter region 28 can be relieved by the third floating emitter region 28c comprising a high resistance region, when the MOS gate thyristor 400 is being turned-off. Thus, the pn junction comprising the first channel region 20a and the n⁻type floating emitter region 28 is not subjected to a breakdown current, enabling a reliable turn-off operation for the transistor.

Furthermore, in the MOS gate thyristor 400, since the second floating emitter region 28b as a part of the floating emitter region 28 is formed so that it extends in the direction of the principal plane of the p⁺ type anode layer 10, a broader path for injecting electrons can be secured to reduce the ON-state voltage.

Fifth Embodiment

Figure 5:
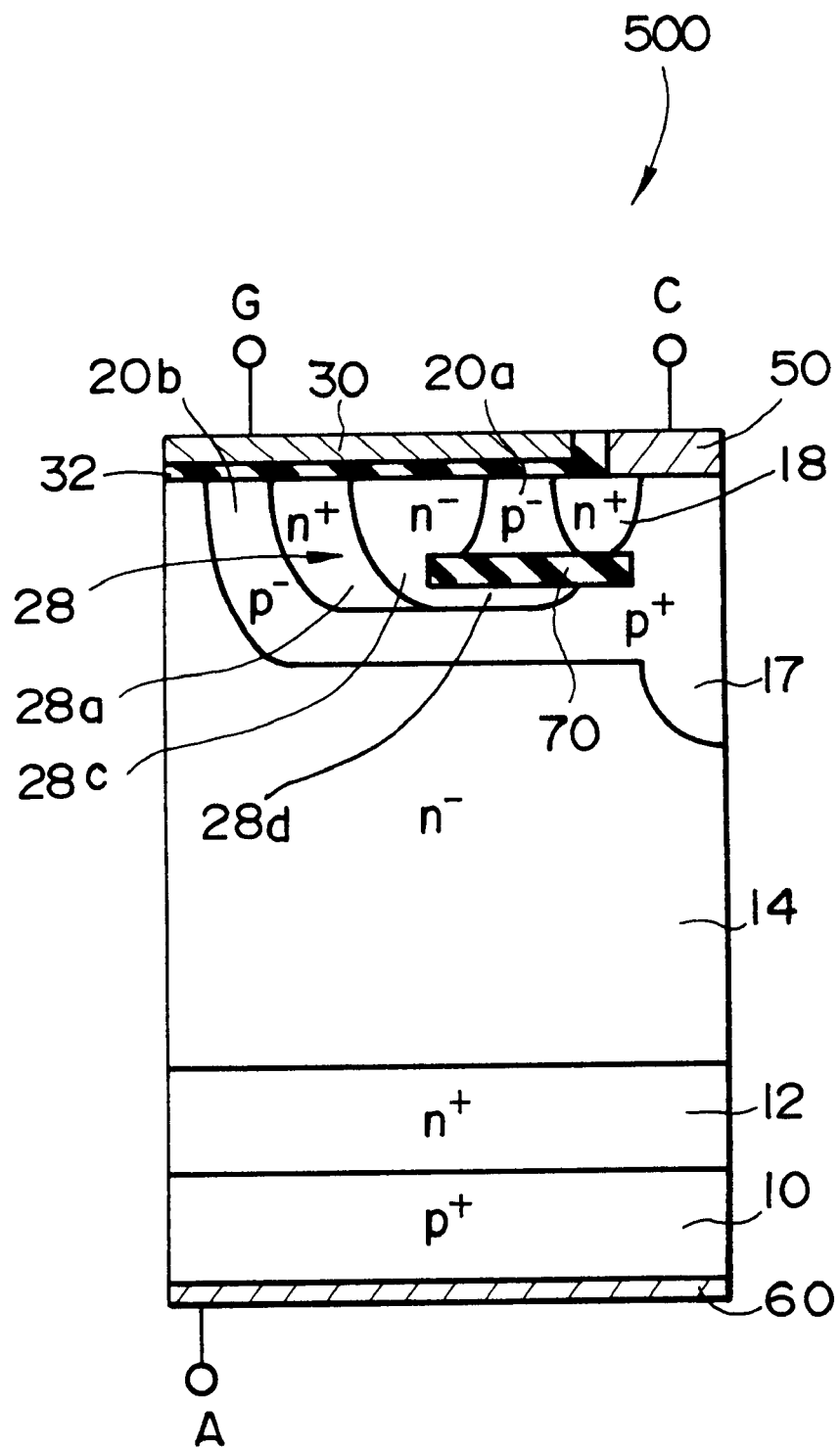
FIG. 5 is a cross-sectional view schematically showing a MOS gate thyristor according to the fifth embodiment of the present invention.

FIG. 5 is a cross-sectional view schematically showing a MOS gate-controlled thyristor, i.e. the MOS gate thyristor 500, in accordance with the present invention. In describing the present embodiment, constituents and their arrangements which are essentially identical to the MOS gate thyristor 400 of the fourth embodiment of the present invention are referred to with the same symbols and without detailed explanations.

The MOS gate thyristor of the present embodiment differs from the fourth embodiment with respect to the configuration of the second floating emitter region 28b. In the present embodiment, the lower end of the floating emitter region 28c (i.e. the fourth floating emitter region 28d) is formed in such a way that it extends along the underside of the insulation layer 70.

In the MOS gate thyristor 500 of the present embodiment, by forming the high-resistivity fourth floating emitter region 28d (extended semiconductor portion) on a portion of the floating emitter region 28 juxtaposing the p⁺ type base region 17 underneath the cathode electrode 50, a voltage rating for the parasitic diode formed by the p⁺ type base region 17 and the floating emitter region 28d, can be higher than that of the MOS gate thyristor 400 of the fourth embodiment, whereby the turn-off operation for the transistor is also ensured. Other operations of the present embodiment are the same as the fourth embodiment of the present invention.

Sixth Embodiment

Figure 6:
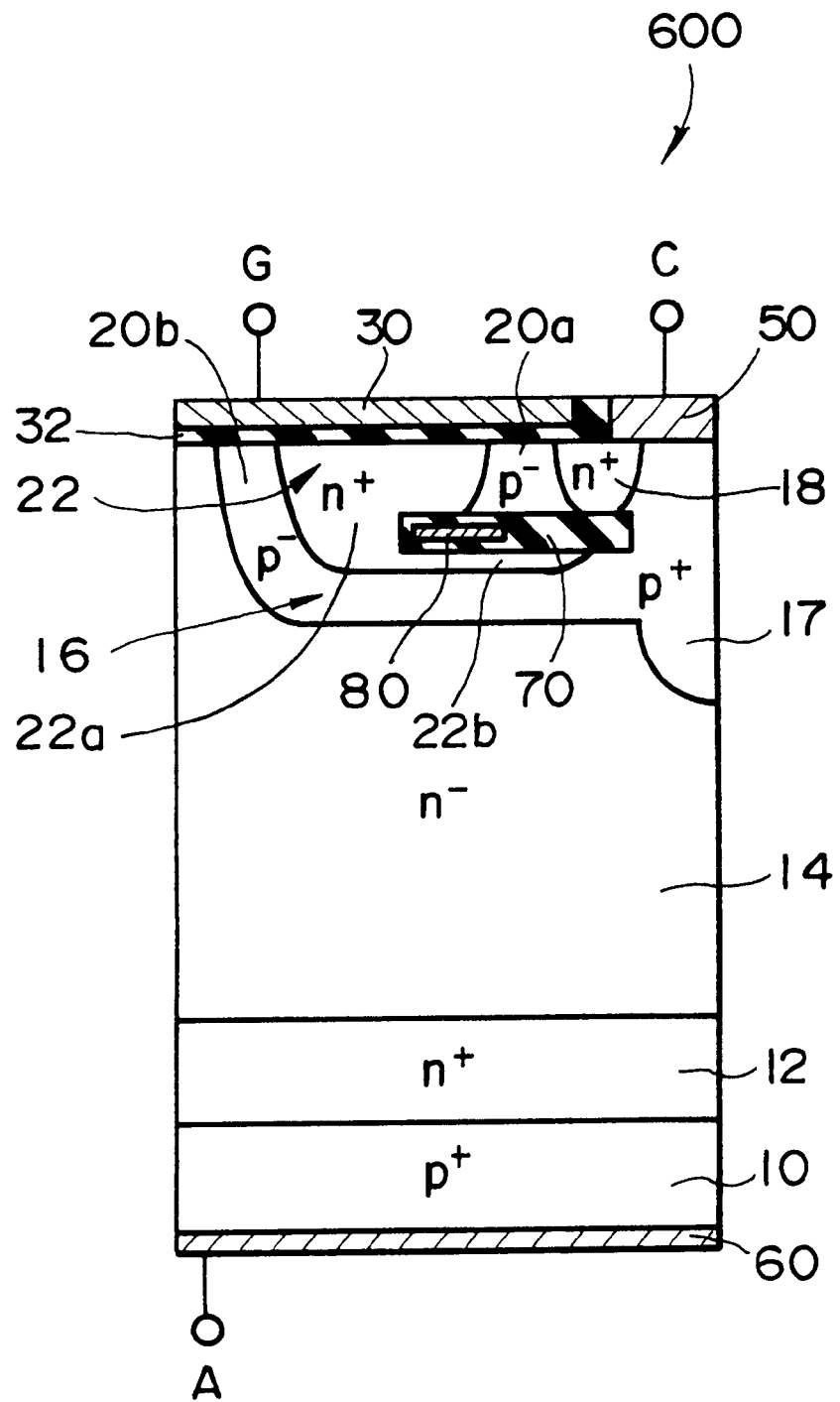
FIG. 6 is a cross-sectional view schematically showing a MOS gate thyristor according to the sixth embodiment of the present invention.

FIG. 6 is a cross-sectional view schematically showing a MOS gate-controlled thyristor, i.e. the MOS gate thyristor 600, in accordance with the present invention. The MOS gate thyristor 600 has a configuration basically similar to the MOS gate thyristor 100 of the first embodiment, but differs from the latter in using an embedded electrode formed within the insulation layer 70. In describing the present embodiment, constituents and their arrangements which are essentially identical to the MOS gate thyristor 100 of the first embodiment of the present invention are referred to with the same symbols and without detailed explanations.

In the present embodiment, the embedded electrode 80 is formed in the insulation layer 70 and is connected to an external terminal with a conductive portion not shown in the illustration. The formation of such an embedded electrode 80 ensures a reliable turn-off operation of the transistor.

In the process of turning off the MOS gate thyristor 600, the gate electrode 30 is brought to the OFF state so that the potential on the n⁺ type floating emitter region 22 is cut off from the cathode electrode 50, thereby terminating the thyristor action.

The element characterizing the present embodiment is that an appropriate potential of either negative or zero voltage is applied to the embedded electrode 80 when turning off the MOS gate thyristor 600, so that the potential at the floating emitter region 22b does not affect the insulation layer 70 even if the potential is raised by the increase in the anode potential. As a consequence, this can prevent the parasitic channel region (back channel) formed on the surface of the insulation layer 70 from becoming active by the anode potential, and therefore ensure a reliable turn-off operation of the transistor. The embedded electrode 80 can be formed not only at the pn junction formed by the first channel region 20a and the n⁺ type floating emitter region 22, but also over a wider range across the first channel region 20a and the p⁺ type base region 17.

The embedded electrode 80 characterizing the present embodiment can be equally applied to other embodiments of the present invention.

Seventh Embodiment

Figure 7:
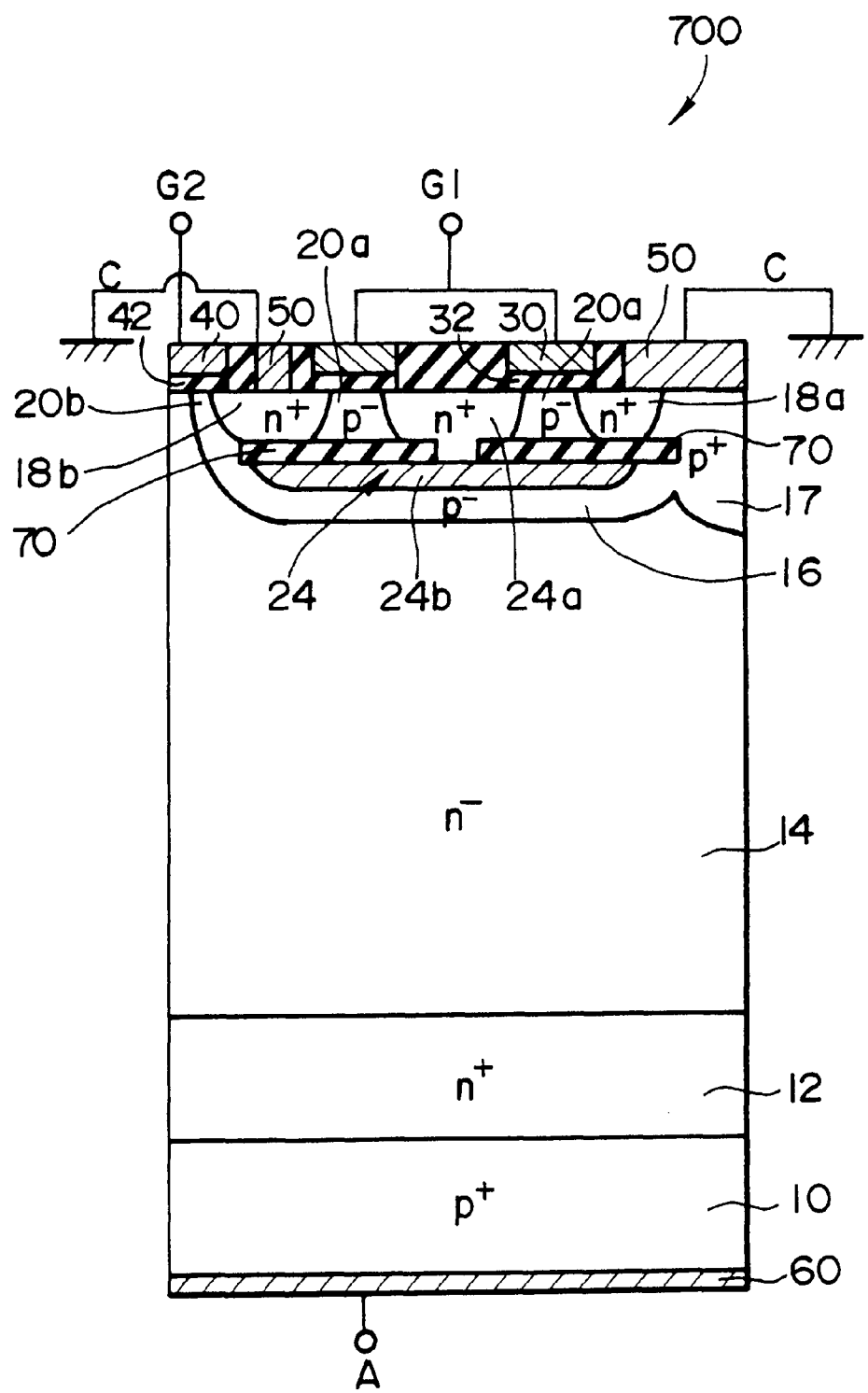
FIG. 7 is a cross-sectional view schematically showing a MOS gate thyristor according to the seventh embodiment of the present invention.

FIG. 7 is a cross-sectional view schematically showing a MOS gate-controlled thyristor, i.e. the MOS gate thyristor 700, in accordance with the present invention. In describing the present embodiment, constituents and their arrangements which are essentially identical to the MOS gate thyristor 200 of the second embodiment of the present invention are referred to with the same symbols and without detailed explanations.

The MOS gate thyristor of the present embodiment differs from the second embodiment in constituting the second floating emitter region 24b (extended semiconductor portion) by a Schottky metal rather than by an n⁺ type impurity diffusion layer. As a metal which can form a Schottky junction with the p⁻ type base region 16, for example, nickel and other metals can be used. By constituting the second floating emitter region 24b with a metal which can form a Schottky junction and configuring it in the p⁻ type base region 16 as described above, a Schottky junction having better forward conduction characteristics than a pn junction can be formed. As a result, the device will have a lower ON-state voltage to improve the thyristor characteristics.

The present embodiment is applicable not only to the above-described second embodiment, but also to the third, fourth, and sixth embodiments of the present invention.

Eighth Embodiment

Figure 8:
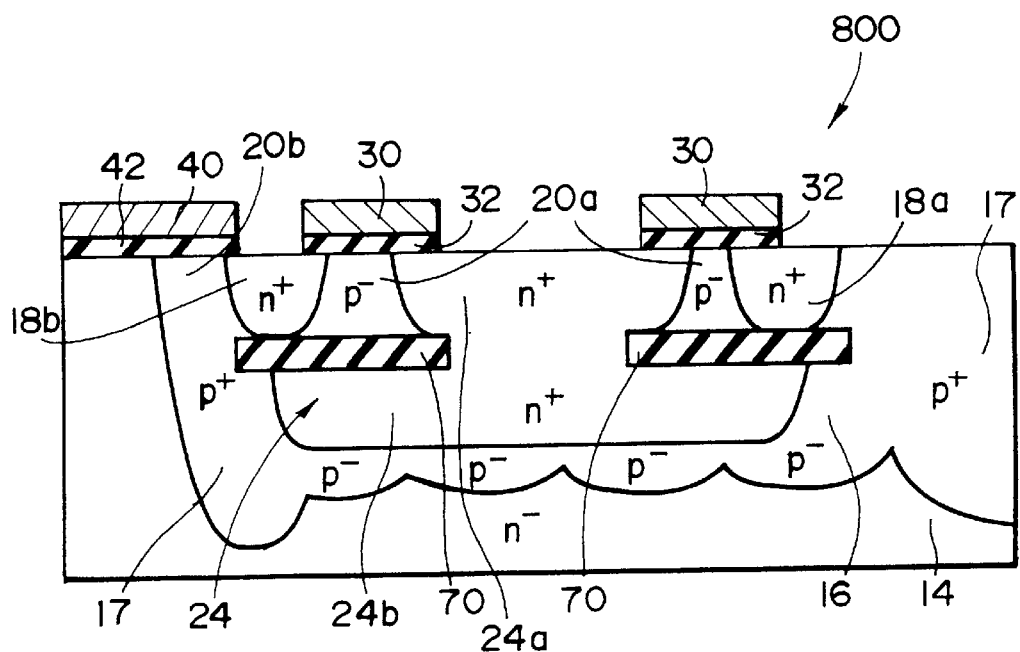
FIG. 8 is a cross-sectional view schematically showing a portion of a MOS gate thyristor according to the eighth embodiment of the present invention.

FIG. 8 is a cross-sectional view schematically showing a MOS gate-controlled thyristor, i.e. the MOS gate thyristor 800, in accordance with the present invention. In describing the present embodiment, constituents and their arrangements which are essentially identical to the MOS gate thyristor 200 of the second embodiment of the present invention are referred to with the same symbols and without detailed explanations.

The element characterizing the present embodiment is that the bottom of the p⁻ type base region 16 located directly under the n⁺ type floating emitter region 24 is formed in a corrugated shape. By forming the bottom of the p⁻ type base region 16 in a corrugated shape as illustrated, diffusion depth in the p⁻ type base region 16 can be made partly shallow. Since a thyristor action tends to occur in such regions with a shallow diffusion depth, the above arrangement has the benefit of lowering the ON-state voltage for the device as a whole.

As a method for forming the bottom of the p⁻ type base region 16 in a corrugated shape, for example, a method to use a heavier ion dosage when implanting a p type impurity into sections intended for a deeper diffusion depth in comparison with those for a shallower diffusion depth and thereafter to perform a thermal treatment can be employed.

The present embodiment is applicable not only to the above-mentioned second embodiment, but also to other embodiments of the present invention.

Ninth Embodiment

Figure 9:
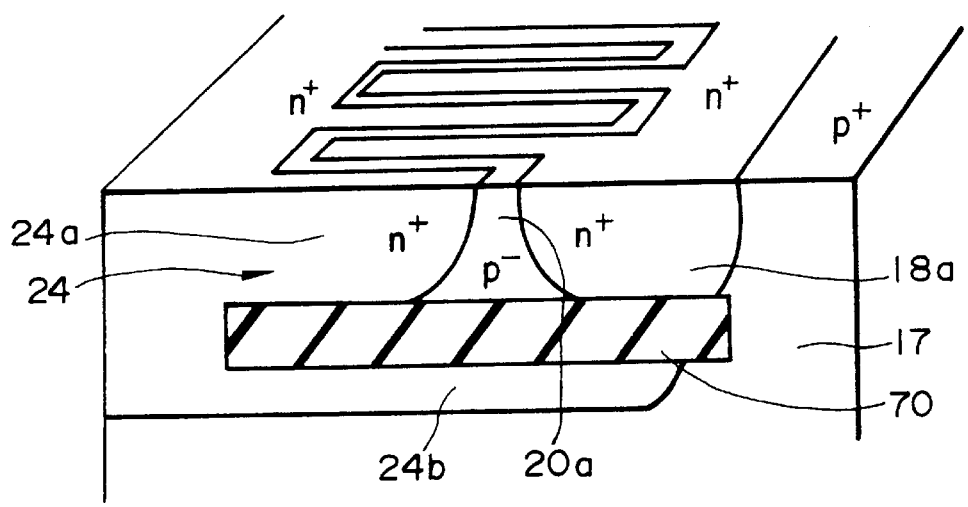
FIG. 9 is a perspective view showing an example of a channel pattern of a MOSFET forming the semiconductor device of the present invention.

FIG. 9 is a perspective view showing an example of a configuration for the first channel region 20a. In describing the present embodiment, constituents and their arrangements that are essentially identical to the MOS gate thyristor 800 as illustrated in FIG. 8 are referred to with the same symbols.

In the illustrated example, the planar pattern of the p– impurity layer constituting the first channel region 20a is configured in a comb-like shape. By configuring the channel region in this manner, the channel width can be broadened without altering the channel length of the MOSFET, thereby enabling raising the transconductance of the MOSFET. The present embodiment can be applicable not only to the first channel region but also to other channel regions, as well as to all embodiments of the present invention.

Tenth Embodiment

Figure 12:
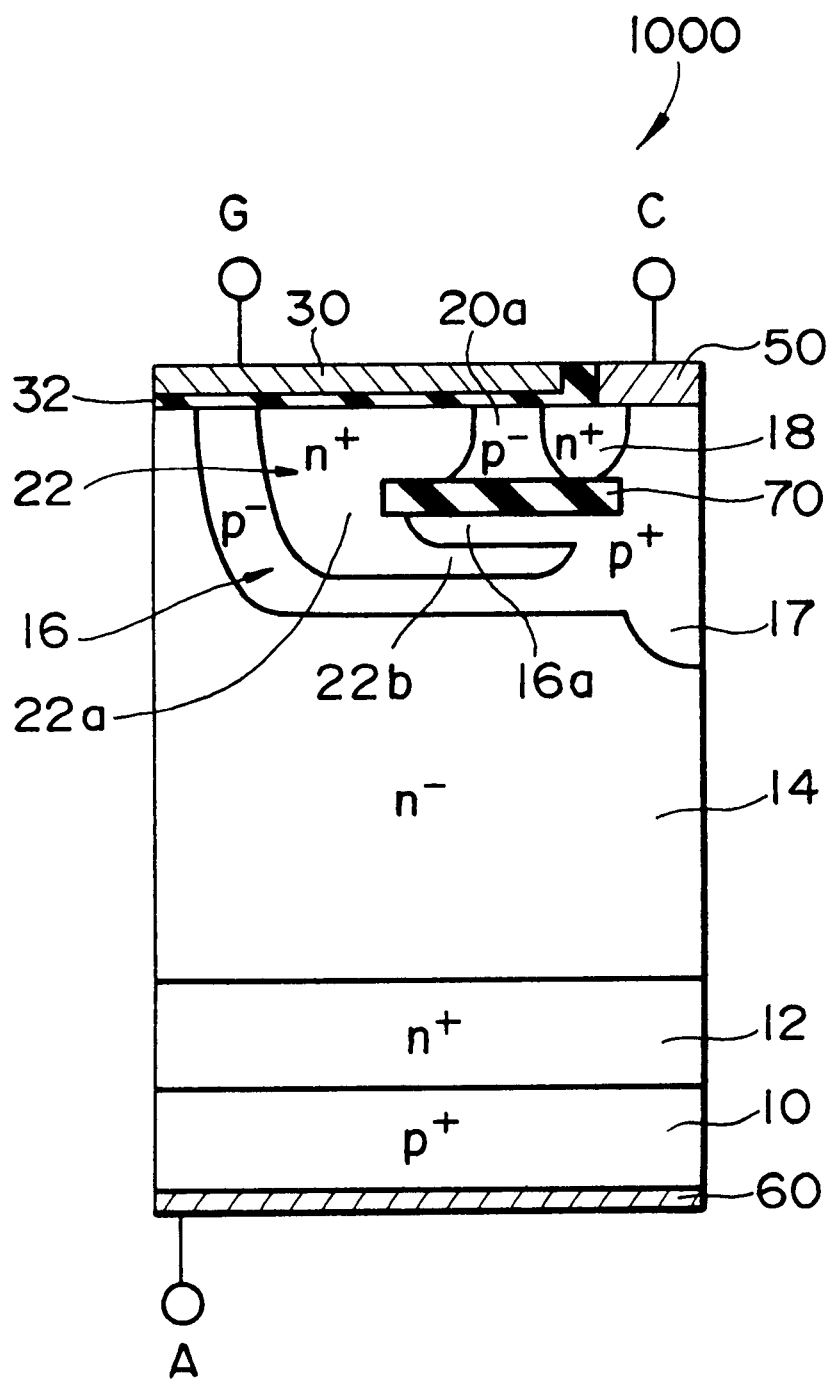
FIG. 12 is a cross-sectional view schematically showing a MOS gate thyristor according to the tenth embodiment of the present invention.

FIG. 12 is a cross-sectional view schematically showing a MOS gate-controlled thyristor, i.e. the MOS gate thyristor 1000, in accordance with the present invention. The MOS gate thyristor 1000 is almost identical to the MOS gate thyristor 100 of the first embodiment, with the exception of the configuration of the second floating emitter region. In FIG. 12, constituents and their arrangements which are essentially identical to the MOS gate thyristor 100 as illustrated in FIG. 1 are referred to with the same symbols.

In the MOS gate thyristor 1000 of the present embodiment, the second floating emitter region 22b (extended semiconductor portion) is formed apart from the backside of the insulation layer 70, while a p type semiconductor region 16b is formed in the space between the insulation layer 70 and the second floating emitter region 22b. Because of the existence of the semiconductor region 16b, the potential at the second floating emitter region 22b does not affect the insulation layer 70 even if the potential is raised by the increase in the anode potential. As a consequence, the parasitic channel region (back channel) formed on the surface of the insulation layer 70 can be prevented from becoming active by the anode potential, and therefore a more reliable turn-off operation of the transistor is ensured.

The above-described configuration to characterize the present embodiment can be applied to other embodiments of the present invention.

Method for Forming the Insulation Layer

While there are no specific restrictions to the method for forming the insulation layer 70 in the present invention, typical fabrication method is described below. A semiconductor layer containing an insulation layer can be implemented by using an SOI (Silicon-on-Insulator) technique.

Figure 10A:
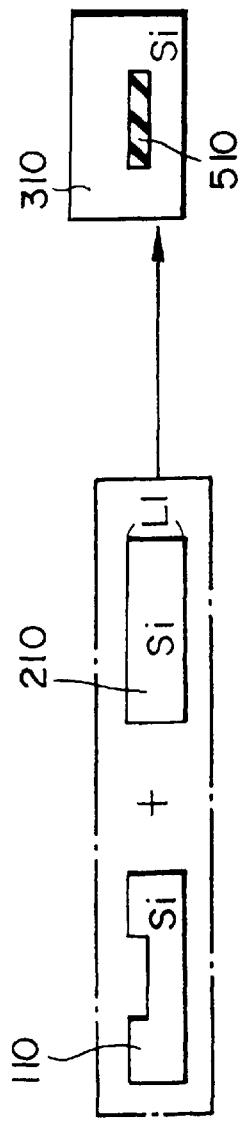
FIGS. 10A, 10B, and 10C are diagrams showing typical methods for forming an insulation layer within a semiconductor layer.
Figure 10B:
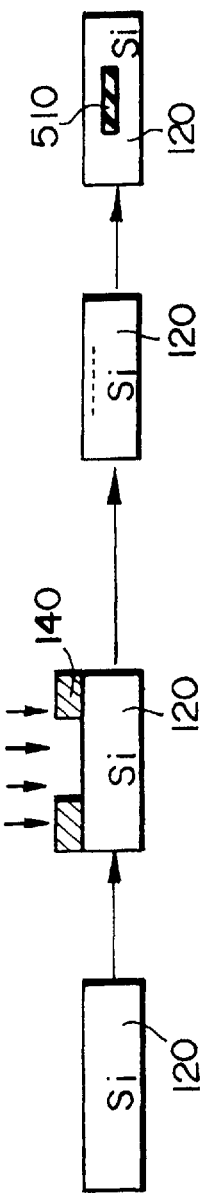
Figure 10C:
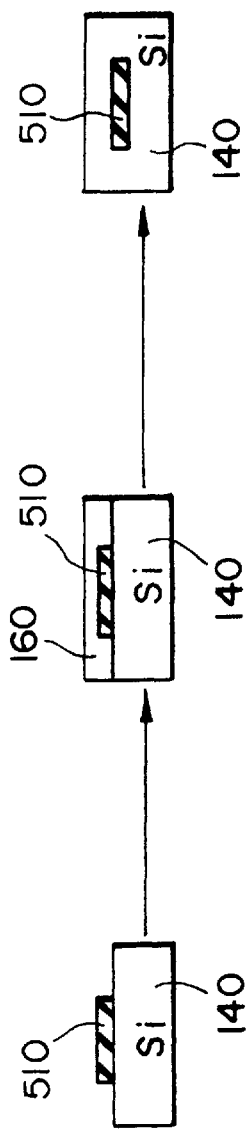
Figure 11:
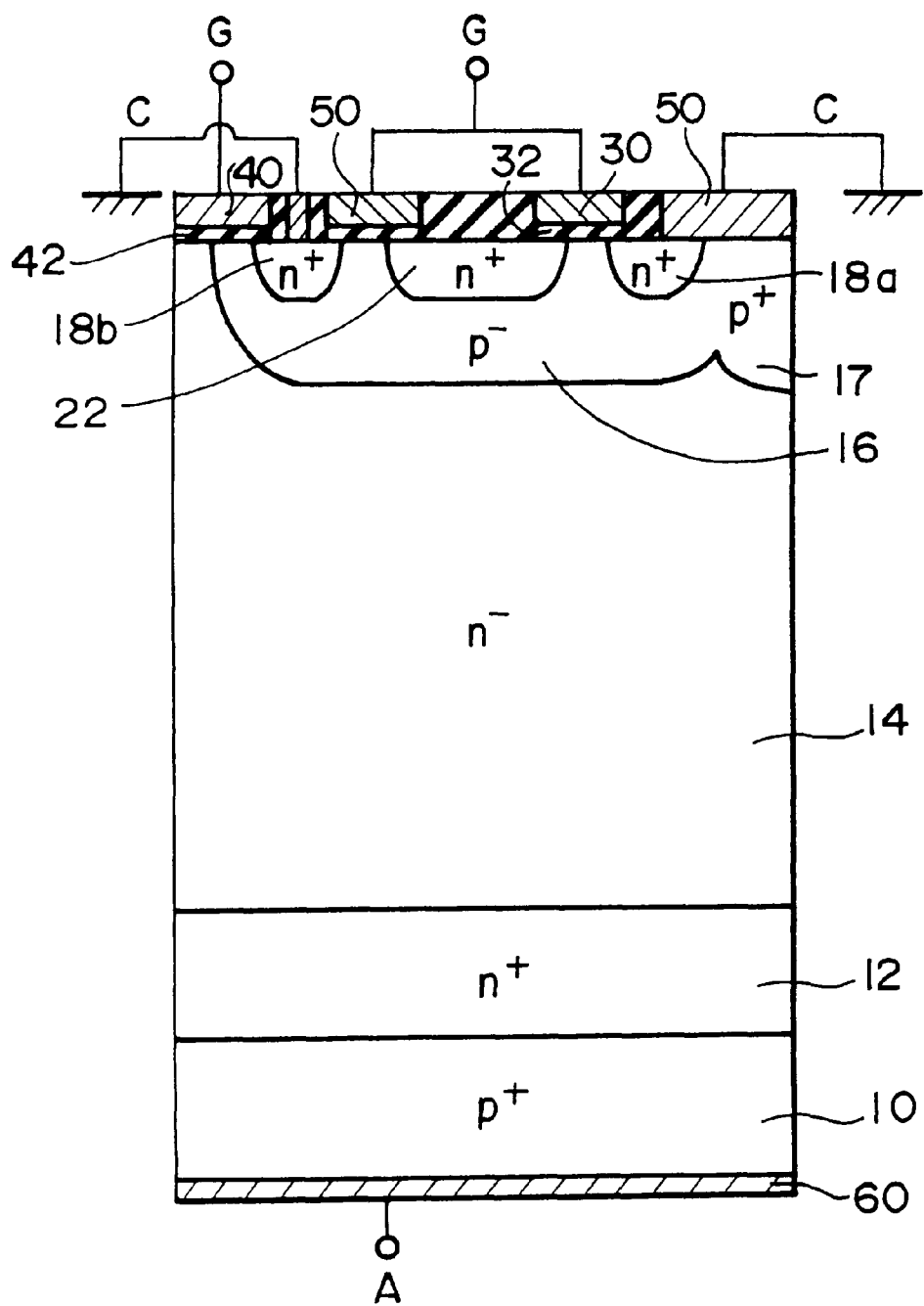
FIG. 11 is a cross-sectional view schematically showing a semiconductor device of the prior art.

FIG. 10A is a schematic diagram showing a method for fabricating an embedded insulation layer using a coupling method which is one of the SOI substrate fabrication techniques, FIG. 10B shows a method for fabricating the same using a SIMOX method (i.e. an oxygen ion injection method), and FIG. 10C shows a method based on an SPE method (i.e. recrystallization method).

With the coupling method illustrated in FIG. 10A, a partially modified silicon substrate 110 with a recess formed in the center of its surface and another silicon substrate 210 are joined together while performing a thermal treatment in an oxygen atmosphere to fabricate an SOI substrate 310 within which an insulation layer ($SiO_2$ layer) 510 is embedded.

In the above procedure, the thermal treatment performed in an oxygen atmosphere promotes oxidation of silicon in the recessed portion at the center to form the $SiO_2$ layer 510. Since silicon increases its volume when oxidized, the $SiO_2$ layer 510 thus formed will fill up the recess to fabricate the SOI substrate 310 within which the insulation layer 510 ($SiO_2$ layer) is embedded.

With the SIMOX method illustrated in FIG. 10B, a mask 140 is formed on a silicon substrate 120 and then oxygen ions are selectively implanted. Subsequently after removing the mask 140, the oxygen ions are activated with a thermal treatment to fabricate the insulation layer 510 ($SiO_2$ layer) embedded in the silicon substrate 120.

With the SPE method (recrystallization method) illustrated in FIG. 10C, an insulation layer 510 is selectively formed on a silicon substrate 140 beforehand, then a polysilicon layer 160 is deposited, followed by a step to recrystallize the polysilicon layer 160 with a thermal treatment to fabricate the silicon substrate 140 in which the insulation layer 510 ($SiO^2$ layer) is embedded.

In the embodiments of the present invention, semiconductor devices using a p type semiconductor as the first conductive type and an n type semiconductor as the second conductive type have been described. However, semiconductor devices with reversed conductive types may be implemented.

What is claimed is:

1. A semiconductor device comprising:
   a first semiconductor layer of a first conductive type;
   a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer so as to underlie the sixth semiconductor layer.

2. The semiconductor device according to claim 1, wherein the fifth semiconductor layer further comprises a region having a higher resistance than other regions in the fifth semiconductor layer, said high resistance region contacting the sixth semiconductor layer.

3. The semiconductor device according to claim 2, wherein the high resistance region has a portion which is in contact with the insulation layer on the side facing the first semiconductor layer.

4. The semiconductor device according to claim 1, wherein the gate insulation layer and the gate electrode are formed on the surfaces of the fifth semiconductor layer and the third semiconductor layer, and a portion of an IGBT region is formed on a surface of a transistor.

5. The semiconductor device according to claim 1 further comprising:

a seventh semiconductor layer of the second conductive type selectively formed apart from the fifth semiconductor layer;

an eighth semiconductor layer of the first conductive type located between the fifth semiconductor layer and the seventh semiconductor layer, which can form a channel region;

a gate electrode formed via an interposed gate insulation layer on the surface of at least the third semiconductor layer that is in contact with the seventh semiconductor layer;

a second insulation layer located within the third semiconductor layer and formed either at or near the extremities of at least the seventh semiconductor layer as well as the eighth semiconductor layer on a side facing the first semiconductor layer; and a third main electrode formed on the surface of the seventh semiconductor layer, wherein the two gate electrodes can be operated independently of each other.

6. The semiconductor device according to claim 5, wherein the second insulation layer is formed in the direction of the principal plane of the first semiconductor layer.

7. The semiconductor device according to claim 5, wherein a ninth semiconductor layer of the second conductive type is formed on the surface of the third semiconductor layer apart from the seventh semiconductor layer, and a tenth semiconductor layer of the first conductive type, and configured to form a channel region, is formed between the seventh semiconductor layer and the ninth semiconductor layer.

8. The semiconductor device according to claim 1, wherein the third semiconductor layer is formed with a corrugated shape at its base and having impurity diffusion depths that are partly shallower at a plurality of locations.

9. The semiconductor device according to claim 1, wherein the planar pattern of the sixth semiconductor layer is configured in a comb-like shape.

10. The semiconductor device according to claim 1, wherein an embedded electrode is formed within the insulation layer.

11. The semiconductor device according to claim 1, wherein the extended semiconductor portion of the fifth semiconductor layer is formed separately from the insulation layer and a semiconductor layer of the first conductive type is interposed between the extended semiconductor portion and the insulation layer.

12. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

a first insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, a seventh semiconductor layer of the second conductive type selectively formed apart from the fifth semiconductor layer;

an eighth semiconductor layer of the first conductive type located between the fifth semiconductor layer and the seventh semiconductor layer, and configured to form a channel region;

a gate electrode formed via an interposed gate insulation layer on the surface of at least the third semiconductor layer contacting the seventh semiconductor layer;

a second insulation layer located within the third semiconductor layer and formed either at or near the extremities of at least the seventh semiconductor layer and the eighth semiconductor layer on the side facing the first semiconductor layer; and a third main electrode formed on the surface of the seventh semiconductor layer, wherein the two gate electrodes can be operated independently of each other, and wherein the fifth semiconductor layer has an extended semiconductor portion extending in the direction parallel to the principal plane of the first semiconductor layer.

13. The semiconductor device according to claim 12, wherein the second insulation layer is formed in the direction of the principal plane of the first semiconductor layer.

14. The semiconductor device according to claim 12, further comprising:

a ninth semiconductor layer of the second conductive type formed on the surface of the third semiconductor layer apart from the seventh semiconductor layer; and a tenth semiconductor layer of the first conductive type, and configured to form a channel region, formed between the seventh semiconductor layer and the ninth semiconductor layer.

15. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer, wherein the fifth semiconductor layer further comprises a region having a higher resistance than other regions in the fifth semiconductor layer, said high resistance region contacting the sixth semiconductor layer, and wherein the high resistance region has a portion contacting the insulation layer on the side facing the first semiconductor layer.

16. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer, and wherein the gate insulation layer and the gate electrode are formed on the surfaces of the fifth semiconductor layer and the third semiconductor layer, and a portion of an IGBT region is formed on the surface of a transistor.

17. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side f acing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer, and wherein the planar pattern of the sixth semiconductor layer is configured in a comb-like shape.

18. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer, and wherein an embedded electrode is formed within the insulation layer.

19. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion extending in the direction parallel to the principal plane of the first semiconductor layer, and wherein the extended semiconductor portion of the fifth semiconductor layer is formed separately from the insulation layer and a semiconductor layer of the first conductive type is interposed between the extended semiconductor portion and the insulation layer.

20. A semiconductor device comprising:

a first semiconductor layer of a first conductive type;

a second semiconductor layer of a second conductive type formed on a side of the principal plane of the first semiconductor layer;

a third semiconductor layer of the first conductive type selectively formed on the surface of the second semiconductor layer;

a fourth semiconductor layer of the second conductive type selectively formed on the surface of the third semiconductor layer;

a fifth semiconductor layer of the second conductive type selectively formed on the surface of the third semiconductor layer apart from the fourth semiconductor layer;

a sixth semiconductor layer of the first conductive type located between the fourth semiconductor layer and the fifth semiconductor layer, and configured to form a channel region;

a gate electrode formed via an interposed gate insulation layer on the surface of at least the sixth semiconductor layer;

an insulation layer located within the third semiconductor layer and formed either at or near the extremities of at least the fourth semiconductor layer and the sixth semiconductor layer on the side facing the first semiconductor layer;

a first main electrode formed on the surfaces of the third semiconductor layer and the fourth semiconductor layer; and a second main electrode formed on the side opposite the principal plane of the first semiconductor layer, wherein the fifth semiconductor layer has an extended semiconductor portion comprising a Schottky metal and extending in the direction parallel to the principal plane of the first semiconductor layer.

* * * * *